United States Patent [19]

Machida

[11] 4,021,742
[45] May 3, 1977

[54] PHASE COMPRESSOR FOR PHASE MODULATED SIGNAL

[75] Inventor: Yukihiko Machida, Mitaka, Japan

[73] Assignee: Sony Corporation, Tokyo, Japan

[22] Filed: Jan. 26, 1976

[21] Appl. No.: 652,613

Related U.S. Application Data

[63] Continuation of Ser. No. 620,151, Oct. 6, 1975, abandoned.

[30] Foreign Application Priority Data

Oct. 7, 1974 Japan .............................. 49-115316

[52] U.S. Cl. .................................. 329/50; 325/349; 328/134; 328/155; 329/124
[51] Int. Cl.[2] ........................................ H03D 3/02
[58] Field of Search ............ 329/50, 104, 105, 107, 329/110, 122, 124; 328/134, 155; 325/346, 349

[56] References Cited

UNITED STATES PATENTS

3,358,240 12/1967 McKay .............................. 329/122

Primary Examiner—Siegfried H. Grimm
Attorney, Agent, or Firm—Lewis H. Eslinger; Alvin Sinderbrand

[57] ABSTRACT

A phase compressor for a phase modulated signal comprises $n$ phase suppressors ($n$ is an integer greater than 2), each of which includes an adder and a limiter. The $n$ phase suppressors are connected in series with one another. In this case, outputs from the limiters of $n$th, $(n - 1)$th, $(n - 2)$th, .... 2nd phase suppressors are individually supplied to the adders along with outputs from the $(n - 1)$th, $(n - 2)$th, .... 1st phase suppressors, respectively. A reference signal is supplied to the adder of the $n$th phase suppressor, by which a modulated phase angle of the phase modulated signal with a wide modulation index is phase-compressed by $1/_{n+1}$. The phase compressed signal is phase-demodulated by a phase demodulator without decreasing a signal-noise ratio.

5 Claims, 10 Drawing Figures

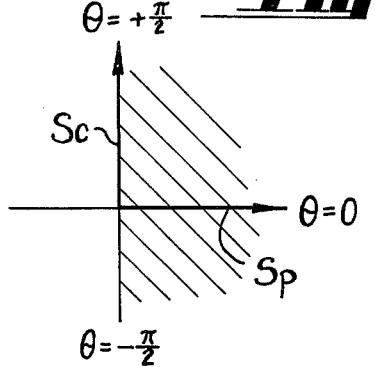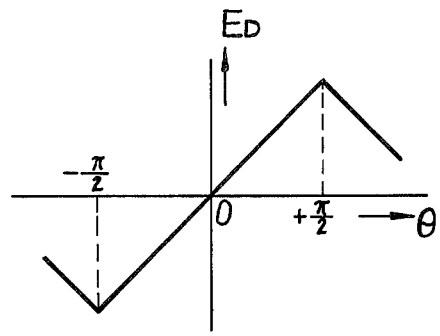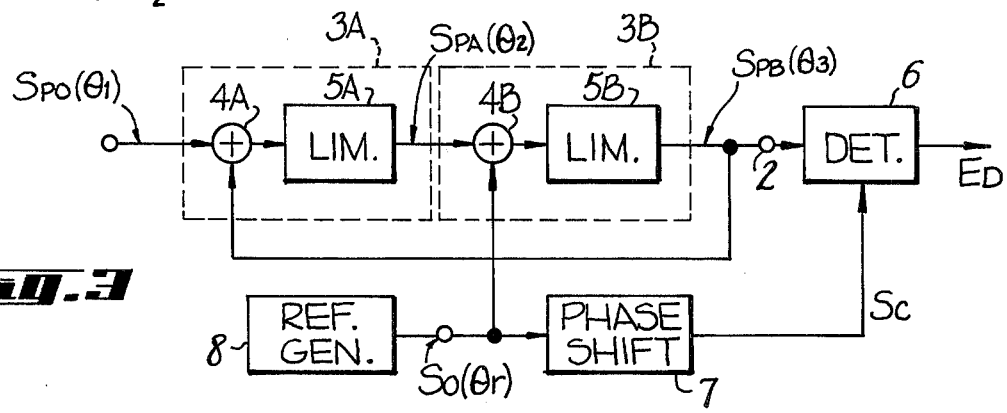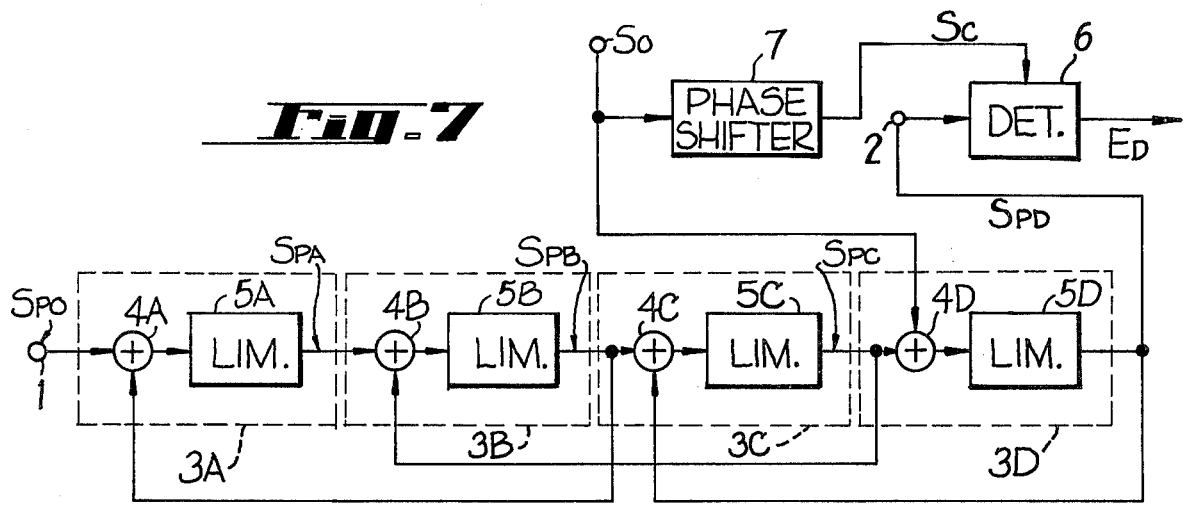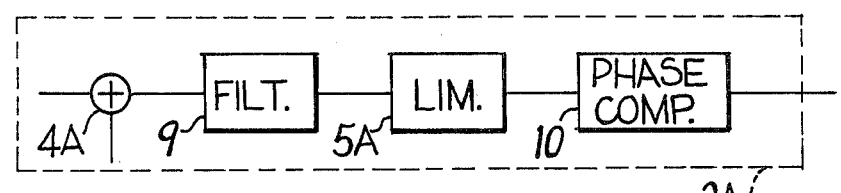

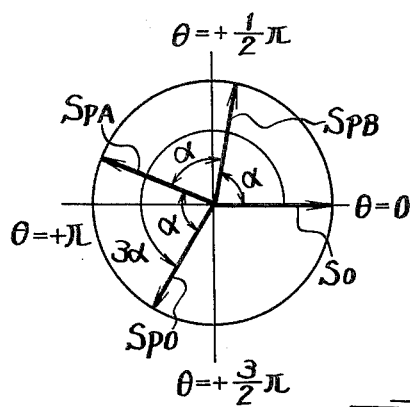
Fig. 4
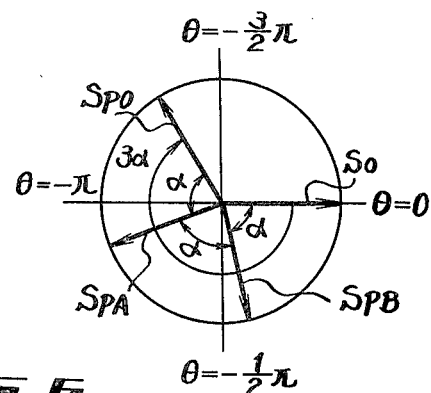
Fig. 5
Fig. 6
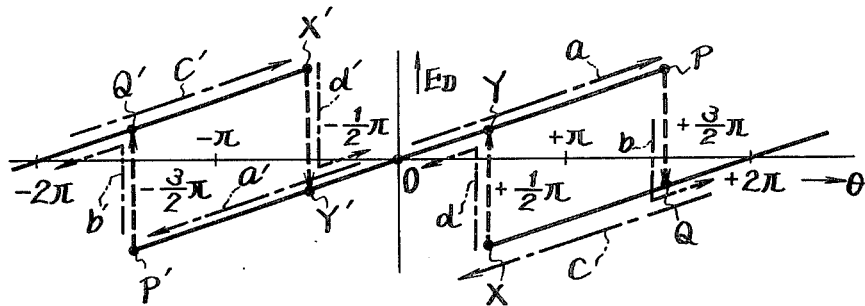
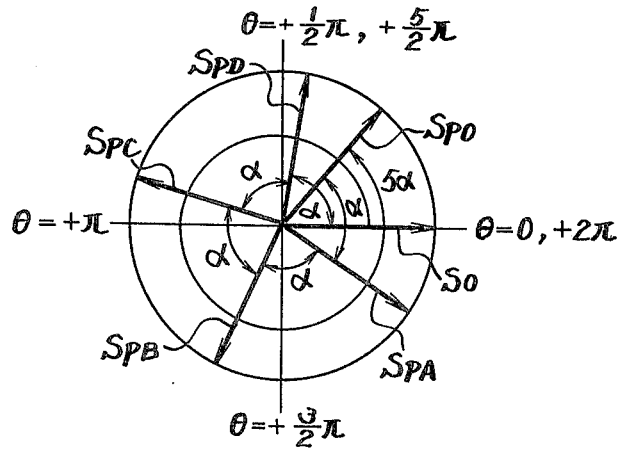
Fig. 8
Fig. 9
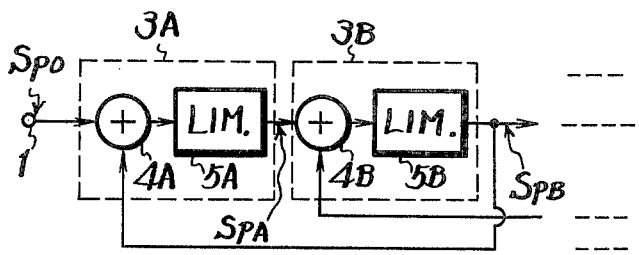
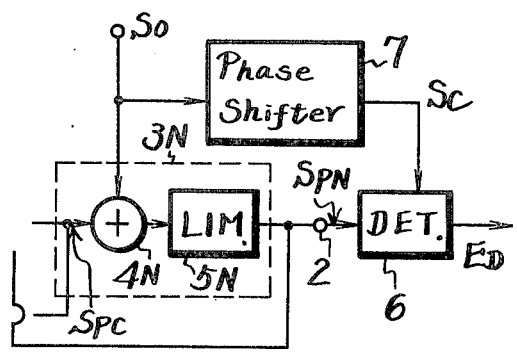

PHASE COMPRESSOR FOR PHASE MODULATED SIGNAL

This is a continuation of Ser. No. 620,151 filed Oct. 6, 1975 and now abandoned.

BACKGROUND OF THE INVENTION

1. Field of the Invention

The present invention relates generally to a phase compressor which phase-compresses a phase modulated signal, and is directed more particularly to a phase compressor which compresses the phase of a signal with a large phase modulation angle and then supplies the phase compressed signal to a phase detector.

2. Description of the Prior Art

There are existing phase detectors that have a limitation such that the phase modulation angle $\theta$ of the phase modulated signal must be $-\pi/2 < \theta < \pi/2$. This limits the sensitivity of modulation and hence the sensitivity of detection. Limiting the maximum value of the phase modulation angle $\theta$ also limits the modulation index and makes it difficult to obtain a good signal-noise ratio.

To avoid this limitation, it has been proposed that the phase of the reference carrier signal used for phase detection be shifted by a predetermined angle before this phase-shifted reference carrier signal is added to a phase modulated signal (for example, a phase modulated television signal). The phase of the resultant signal is compared with the reference carrier signal, and satisfactory phase demodulation is possible, even if the phase of the modulated signal is varied by an angle greater than $+\pi/2$ and smaller than $-\pi/2$. That type of the phase demodulator is disclosed in U.S. patent application Ser. No. 519,028 filed Oct. 29, 1974, now U.S. Pat. No. 3,949,314 and assigned to the same assignee as the present application. The phase demodulator of that application can demodulate a signal that has its phase modulated by an angle $|\theta| > \pi/2$, but the circuit is still limited to demodulating signals phase-modulated by an angle $|\theta| < \pi$.

SUMMARY OF THE INVENTION

Accordingly, an object of the present invention is to provide a phase compressor for a phase-modulated signal which compresses or suppresses the phase of a phase-modulated signal, and with which detection is possible even if a signal is modulated with a phase range greater than the phase range that can be demodulated by prior art circuits or at sufficiently great modulation index at the modulation stage.

According to one aspect of the invention, there is provided a phase modulation circuit in which at least two phase suppressors, each consisting of an adder and a limiter, are connected in series with each other between output and input terminals of the demodulation circuit. A phase-modulated input signal and an output signal from the second-stage phase suppressor are supplied to the adder at the input of the first-stage phase suppressor, and a reference carrier signal is supplied to the adder at the input of the second-stage phase suppressor. A phase-modulated signal is obtained at the output terminal, and the phase of the modulation angle is compressed compared with that of the input phase modulated signal by an amount related to the number of phase suppressors in the circuit. There can be more than two phase suppressors, each having an adder. Each adder receives the output signal of the immediately preceding phase suppressor and the output signal of the second succeeding suppressor, except the first and last adders, which receive the original phase-modulated input signal and a reference signal, respectively, as has just been stated.

BRIEF DESCRIPTION OF THE DRAWINGS

FIGS. 1 and 2 are graphs used for explaining the phase detection characteristics.

FIG. 3 is a block diagram showing one embodiment of a phase compressor for a phase modulated signal according to the present invention.

FIGS. 4 and 5 are vector diagrams used for explaining the embodiment of the invention shown in FIG. 3.

FIG. 6 is a graph used for explaining the embodiment shown in FIG. 3.

FIG. 7 is a block diagram showing another embodiment of the invention.

FIG. 8 is a vector diagram used for explaining the embodiment of the invention shown in FIG. 7.

FIG. 9 is a block diagram showing a further embodiment of the invention.

FIG. 10 shows a modification of a limiter circuit in FIG. 3.

DESCRIPTION OF THE PREFERRED EMBODIMENTS

In order to detect, or demodulate, a phase-modulated signal, a reference signal $S_C$ which is shifted in phase by $\pi/2$ from the center, or unmodulated, phase of a phase-modulated signal $S_p$ is used, as shown in FIG. 1. Accordingly, the amplitude of a demodulated voltage $E_D$ as a function of the phase $\theta$ of the signal $S_p$ relative to the center phase at which the angle $\theta = 0$ is shown in FIG. 2 and the range of $-\pi/2 < \theta < \pi/2$ is shown in FIG. 1 as a shaded area within which signals can be demodulated.

A circuit for demodulating such a signal is described in detail in the previously mentioned U.S. patent application Ser. No. 519,028 and hence need not be repeated. However, it may be understood that if the phase angle $\theta$ of an input signal to the phase detector is within a range that extends beyond $|\theta| < \pi$, for example, $-5/2\ \pi < \theta < 5/2\ \pi$, the phase detection cannot be carried out in that circuit.

FIG. 3 shows a phase compressor circuit for use in demodulating a phase modulated signal according to the present invention. In the circuit in FIG. 3, between an input terminal 1 and an output terminal 2, are two phase suppressors 3A and 3B connected in series. The phase suppressor 3A consists of an adder 4A followed by a limiter 5A, and the other phase suppressor 3B consists of an adder 4B followed by a limiter 5B. The adder 4A is connected to the input terminal 1. An input signal $S_{PO}$ such as, for example, a phase modulated television signal is supplied to the input terminal 1, and an output signal from the limiter 5B of the phase suppressor 3B is connected back to a second input terminal of the adder 4A of the phase suppressor 3A. A reference carrier signal $S_O$ is connected to a second input terminal of the adder 4B of the rear stage phase suppressor 3B. Signal $S_O$ is generated in a source 8.

The phase of the reference carrier signal $S_O$ is selected to be the same as the center phase about which the input phase modulated signal $S_{PO}$ is phase-modulated in advancing and delaying directions. This center phase corresponds to the phase of the signal $S_{PO}$ in the absence of modulation, and under that condition the frequency of the reference carrier signal $S_O$ is identical with the instantaneous frequency of the signal $S_{PO}$.

Accordingly, as shown in FIG. 4, if a signal $S_{PA}$ derived from the limiter 5A of the phase suppressor 3A and having the same amplitude as the reference carrier signal $S_O$ and shifted in phase in the advancing direction by an angle less than $\pi$ and is added vectorially with the signal $S_O$ in the adder 4B of the phase suppressor 3B, an output signal $S_{PB}$ will be obtained from the limiter 5B. The output signal $S_{PB}$ from the phase suppressor 3B is limited to have the same amplitude as the reference carrier signal $S_O$ and is shifted in phase by an angle less than $\pi/2$ in the advancing direction from the signal $S_O$. If the amplitude of the input signal $S_{PO}$ is made the same as the amplitude of the reference carrier signal $S_O$, for example, by a limiter ahead of the input terminal 1, and the phase of the input signal $S_{PO}$ is within an angle less than $3/2\ \pi$ in the advancing direction from the phase angle of the reference carrier signal $S_O$, the signals $S_{PO}$ and $S_{PB}$ added in the adder 4A of the phase suppressor 3A will produce an output signal from the adder 4A. After that output signal passes through the limiter 5A, it is the signal $S_{PA}$, which is the same in amplitude as the reference carrier signal $S_O$ and has been shifted in phase so that it is within the angle $\pi$ in the advancing direction from the signal $S_O$. The signal $S_{PA}$ is the output signal obtained from the suppressor 3A.

Thus it may be seen that if the input signal $S_{PO}$ is subjected, by phase-modulation, to a phase displacement in the advancing direction from the center phase and the range of the phase displacement is within $3/2\ \pi$ relative to the center phase, the range of the phase displacement of the output signal $S_{PA}$ from the suppressor 3A is within $\pi$ for the center phase and the range of the phase displacement of the output signal from the suppressor 3B of the signal $S_{PB}$ obtained at the output terminal 2 is within $\pi/2$ relative to the center phase. When the input signal $S_{PO}$ is subjected by the phase-modulating signal to a phase displacement in the delaying direction from the center phase, as shown in FIG. 5, the same results will be obtained as those described above.

As shown in FIG. 4, when the input signal $S_{PO}$ is selected to be ahead of the reference carrier signal $S_O$ by $3\alpha$ (smaller than $3/2\ \pi$), the output signal $S_{PA}$ from the suppressor 3A is delayed from the signal $S_{PO}$ by $\alpha$ and the output signal $S_{PB}$ from the suppressor 3B is delayed by $\alpha$ from the signal $S_{PA}$. Accordingly, if the signal $S_{PB}$ obtained at the output terminal 2 is applied to a detector 6, the reference carrier signal $S_O$ is applied by a source 8 to a phase shifter 7 to provide a signal $S_C$ which is shifted by $\pi/2$ from the center phase, and the signal $S_C$ is supplied to the detector 6, a detected voltage $E_D$ will be obtained from the detector 6. The relationship between the amplitude of the signal $E_D$ and the phase angle $\theta$ of the input signal $S_{PO}$ is shown in FIG. 6 as resembling a hysteresis characteristic. That is, when the abscissa of the graph shown in FIG. 6 represents the phase modulated angle $\theta$ of the input signal $S_{PO}$ to the phase suppressor 3A, if the input signal $S_{PO}$ is varied within the range of $-3/2\ \pi < \theta < 3/2\ \pi$, the output variations shown by one-dot line traces $a$ and $a'$ in FIG. 6 are obtained.

When the input signal $S_{PO}$ is varied over the ranges of $\theta \geq 3/2\ \pi$ and $\theta \leq -2/3\ \pi$ once, the output is varied at $\pm 3/2\ \pi$ and $\pm 1/2\ \pi$ from the points P, X, P', and X' to points Q, Y, Q' and Y' (P Q; X Y; P' Q' and X' Y') and has traces shown by one-dot lines $b$, $c$, $d$, $b'$, $c$ and $d'$. Peak voltages of the output voltage $E_D$ at $\pm 3/2\ \pi$ and $\pm 1/2\ \pi$ correspond to the output signal $S_{PB}$ at $\pm 1/2\ \pi$. Thus, detection becomes possible within $-3/2\ \pi < \theta < 3/2\ \pi$. That is to say, with the phase compressor for a phase-modulated signal of the invention shown in FIG. 3, the phase of a phase-modulated signal is compressed by $1/3$ as compared with that of the input signal $S_{PO}$. This phase-compressed signal is obtained at the output terminal 2 and hence the detection range can be expanded 3 times. Thus, the modulation index at the modulation stage can be set 3 times greater than was previously possible.

The above will be described mathematically with reference to FIG. 3.

It is assumed that the phase-modulated angles of the respective phase modulated signals $S_{PO}$, $S_{PA}$ and $S_{PB}$ are taken as $\theta_1$, $\theta_2$, and $\theta_3$, the phase angle of the reference carrier signal as $\theta\gamma$ and the following equations (1) and (2) are established.

$$\frac{\theta_1 + \theta_3}{2} = \theta_2 \quad (1)$$

$$\frac{\theta_2 + \theta_\gamma}{2} = \theta_3 \quad (2)$$

The equations (1) and (2) can be rewritten as follows:

$$\theta_1 - 2\theta_2 + \theta_3 = 0 \quad (3)$$

$$2\theta_2 - 4\theta_3 + 2\theta\ \gamma = 0 \quad (4)$$

Therefore, the following equation (5) is obtained by adding the equations (3) and (4).

$$\theta_1 - 3\theta_3 + 2\theta\ \gamma = 0 \quad (5)$$

The equation (5) can be rewritten as follows:

$$\theta_1 - \theta\ \gamma = 3(\theta_3 - \theta\ \gamma) \quad (6)$$

If the phase modulated angle $\theta\gamma$ of the reference carrier signal $S_O$ is selected zero (0), the following result is obtained.

$$\theta_1 = 3\theta_3 \quad (7)$$

The equation (7) means that the input signal $S_{PO}$ with the phase modulated angle of $\theta_1$ is compressed to the output signal $S_{PB}$ with the phase modulated angle of $\theta_3$.

In practice, as shown in FIG. 10, each of the phase suppressors, for example the suppressor 3A, preferably includes a low-pass filter 9 inserted between the adder 4A and the limiter 5A to eliminate higher harmonics. A phase compensator 10 is provided at the rear stage of the limiter 5A to compensate for the phase shift caused by the low-pass filter 9.

Another embodiment of the invention will be now described with reference to FIG. 7 in which the parts shown by the same reference numerals as those of FIG. 3 designate the same elements. In the example of FIG. 7, four phase suppressors 3A, 3B, 3C, and 3D are connected in series between the input and output terminals 1 and 2. The respective suppressors 3A, 3B, 3C and 3D consist of the adders 4A, 4B, 4C and 4D and the limiters 5A, 5B, 5C and 5D, respectively.

As shown in FIG. 7, output signals $S_{PB}$, $S_{PC}$ $S_{PD}$ of the suppressors 3B, 3C and 3D are fed to the adders 4A, 4B and 4C of the suppressors 3A, 3B and 3C, and the adder 4D of the suppressor 3D is supplied with the reference carrier signal $S_O$. The detector 6 and the phase shifter 7 are connected to the last stage suppressor 3D similar to the example of FIG. 3.

With the example shown in FIG. 7, the relationship between the input signal $S_{PO}$ and the output signals $S_{PA}$, $S_{PB}$, $S_{PC}$ and $S_{PD}$ from the respective suppressors 3A to 3D become as shown in FIG. 8, and the phase-modulated signal $S_{PD}$ is obtained at the output terminal 2 whose phase is compressed by 1/5 as compared with that of the input signal $S_{PO}$. Thus, if the phase angle $\theta$ of the input signal $S_{PO}$ is within the range of $-5/2\pi < \theta < 5/2\pi$, the phase of the output signal $S_{PD}$ obtained at the output terminal 2 is kept within the range $-\pi/2$ to $\pi/2$. Thus, detection is possible for the phase angle of $-5/2\pi < \theta < 5/2\pi$, which is expanded by 5 times relative to present-day phase demodulators, and hence the modulation index can be set 5 times greater at the modulation stage.

FIG. 9 shows a further embodiment of the invention in which the parts with the same reference numerals as those of FIGS. 3 and 7 indicate the same parts thereof.

In the example of FIG. 9, $n$ phase suppressors 3A, 3B, ... 3N are used to form the phase compressor of the invention, where $n$ is an integer more than 2. The phase suppressors 3A to 3N consist of the adders 4A to 4N and the limiters 5A to 5N, and also the output signals $S_{PB}$, ... $S_{PN}$ from the 2nd to the last phase suppressors 3B. . . 3N are applied back to the second input terminals of the adders 4A, . . . . 4(n−1) or the adders of the 1st to the last-but-one suppressors, similar to the foregoing examples. Further, the detector 6 and the phase shifter 7 are connected to the last stage phase suppressor 3N and the reference carrier signal $S_O$ is supplied to the adder 4N of the last stage phase suppressor 3N and to the phase shifter 7.

With the phase compressor shown in FIG. 9, the phase-modulated signal $S_{PN}$ is obtained at the output terminal 2 which is phase-compressed by $1/(n+1)$ as compared with the input signal $S_{PO}$, so that the range within which the detection is possible is expanded by $(n+1)$ times and hence the modulation index at the modulation stage can be set by $(n+1)$ times greater.

In the above embodiments of the invention, it is only necessary that the phase shifter 7 phase-shift the reference carrier signal $S_O$ relatively. For example, it may be possible for the reference carrier signal $S_O$ applied to the adder of the last stage phase suppressor to be phase-delayed by the phase shifter 7 from the reference signal applied to the detector 6.

As may be apparent from the foregoing description, with the phase compressor of the invention, the phase range which can be demodulated can be expanded to be as great as desired by increasing the number of phase suppressors.

It may be apparent that many modifications and variations could be effected by one skilled in the art without departing from the spirit or scope of the novel concepts of the present invention.

What is claimed is:

1. A circuit for a phase-modulated signal, said circuit comprising:
    A. a circuit input terminal to receive a phase-modulated signal;
    B. a circuit output terminal at which a phase-compressed phase-modulated signal is obtained;
    C. $n$ phase suppressors, where $n$ is an integer greater than 1, each of said suppressors comprising an adder having first and second input terminals, a limiter, and an output terminal, said phase suppressors being connected in series between said circuit input terminal and said circuit output terminal with the output terminal of each suppressor being connected to a first input terminal of the adder in the next succeeding suppressor, and the output terminal of the $n$th, $(n-1)$th, $(n-2)$th. . .2nd phase suppressors also being individually connected back to said second input terminals of the $(n-1)$th, $(n-2)$th, $(n-3)$th... 1st phase suppressors; and
    D. a reference signal generator connected to the second input terminal of the adder of the $n$th phase suppressor, whereby the angular range of the phase-modulated signal at said circuit output terminal is phase-compressed by $1/(n+1)$ compared to the angular range of said modulated signal at said circuit input terminal.

2. A circuit according to claim 1 wherein said phase suppressors further comprise:
    A. low-pass filters connected between said adders and limiters; and
    B. phase-compensators following said limiters.

3. A circuit according to claim 1 and further comprising:
    A. a phase detector connected to said circuit output terminal; and
    B. a phase shifter connected between said reference signal generator and said phase detector, whereby the output signal of said phase compressor and said reference signal shifted by said phase shifter are phase-compared with each other.

4. A phase demodulator according to claim 3, wherein the output of said phase shifter is phase-shifted by 90° relatively comparing to the input of said shifter.

5. A phase demodulator according to claim 4, wherein said phase-modulated signal at said input terminal is a television signal.

* * * * *